(12) United States Patent
Yano et al.

(10) Patent No.: US 9,395,054 B2
(45) Date of Patent: Jul. 19, 2016

(54) LIGHT SOURCE AND LIGHTING DEVICE INCLUDING THE SAME

(71) Applicants: CITIZEN ELECTRONICS CO., LTD., Yamanashi-ken (JP); CITIZEN HOLDINGS CO., LTD., Tokyo (JP)

(72) Inventors: Takakazu Yano, Tokyo (JP); Tsuyoshi Miura, Yamanashi-ken (JP)

(73) Assignees: CITIZEN ELECTRONICS CO., LTD., Yamanashi-Ken (JP); CITIZEN HOLDINGS CO., LTD., Tokyo (JP)

( * ) Notice: Subject to any disclaimer, the term of this patent is extended or adjusted under 35 U.S.C. 154(b) by 93 days.

(21) Appl. No.: 14/088,928

(22) Filed: Nov. 25, 2013

(65) Prior Publication Data

US 2014/0146533 A1   May 29, 2014

(30) Foreign Application Priority Data

Nov. 26, 2012   (JP) ................................ 2012-257315

(51) Int. Cl.

| | |
|---|---|
| *F21K 99/00* | (2010.01) |
| *H01L 27/15* | (2006.01) |
| *H01L 25/075* | (2006.01) |
| *H05B 33/08* | (2006.01) |
| *F21V 3/00* | (2015.01) |
| *F21Y 101/02* | (2006.01) |
| *F21Y 105/00* | (2016.01) |

(52) U.S. Cl.
CPC ... *F21K 9/50* (2013.01); *F21K 9/13* (2013.01); *F21K 9/135* (2013.01); *H01L 25/0753* (2013.01); *H05B 33/0803* (2013.01); *H05B 33/0857* (2013.01); *H05B 33/0869* (2013.01); *F21V 3/00* (2013.01); *F21Y 2101/02* (2013.01); *F21Y 2105/001* (2013.01); *H01L 2224/48137* (2013.01)

(58) Field of Classification Search
CPC ........... H05B 33/0857; H05B 33/0869; H05B 33/086; H05B 33/0803; H01L 27/156; H01L 25/0753; H01L 2224/48137; G02F 1/133603; F21K 9/50; F21K 9/135; F21K 9/13
USPC ............... 362/249.02, 249.14, 231, 452, 455; 438/28; 315/192, 193, 201, 512, 185
See application file for complete search history.

(56) References Cited

U.S. PATENT DOCUMENTS 6,978,068 B2 * 12/2005 Wilson et al. .................... 385/52
7,843,131 B2 * 11/2010 Konishi et al. ................. 313/505

(Continued)

FOREIGN PATENT DOCUMENTS

| JP | 2000-183404 | 6/2000 |
| JP | 2013-118292 | 6/2013 |

*Primary Examiner* — Anh Mai
*Assistant Examiner* — Arman B Fallahkhair
(74) *Attorney, Agent, or Firm* — Wenderoth, Lind & Ponack, L.L.P.

(57) ABSTRACT

In a first aspect of the present inventive subject matter, a light source includes a substrate that includes a first electrode and a second electrode, and light-emitting elements arranged in an area and divided into groups each including a same number N of light-emitting elements that are electrically connected to one another in series in each group of the groups and that are electrically connected in series to the first electrode and to the second electrode of the substrate, and the light-emitting elements include a first light-emitting element that is configured to start emitting light when a voltage applied to the light-emitting elements exceeds a first voltage value, and the light-emitting elements except the first light-emitting element are configured to start emitting light when the voltage exceeds a second voltage value that is higher than the first voltage value. Also, a lighting device including the light source is disclosed.

16 Claims, 21 Drawing Sheets

(56) References Cited

U.S. PATENT DOCUMENTS

| | | | |
|---|---|---|---|
| 8,018,135 B2* | 9/2011 | Van De Ven et al. | 313/498 |
| 8,226,276 B2* | 7/2012 | Pachler et al. | 362/311.02 |
| 8,476,836 B2* | 7/2013 | van de Ven et al. | 315/193 |
| 8,648,546 B2* | 2/2014 | Van De Ven et al. | 315/294 |

* cited by examiner

LIGHT SOURCE AND LIGHTING DEVICE INCLUDING THE SAME

BACKGROUND OF THE INVENTION

1. Field of the Invention

The present invention relates to a light source including light-emitting elements that are electrically connected to one another in series, and also relates to a lighting device including a light source that includes light-emitting elements electrically connected to one another in series.

2. Description of the Related Art

It is laid open to the public that a light-emitting array includes LED chips that are luminous portions, sub-mount members that are non-luminous portions and connected to each of the LED chips, and a substrate to which the sub-mount members are bonded at regular intervals. Also, a bonding machine to position the LED chip on the substrate is disclosed. The bonding machine includes means to hold the LED chip for positioning the LED chip on a bonding position of the substrate. It is also disclosed that the bonding machine includes means to light the luminous portion of the LED chip which is held by the means of the bonding machine. Furthermore, it is explained that the bonding machine includes means to recognize a coordinate of light-emitting center of the LED chip as an image. (For reference, see Japanese Unexamined Patent Application Publication No. 2000-183404).

Also, it is laid open to the public that a lighting device includes light-emitting elements arranged in lines that are extended in parallel with one another, the light-emitting elements being divided into groups each including the same number of light-emitting elements, a first connecting electrode is disposed adjacent to one end portion of the lines extended, a second connecting electrode is disposed adjacent to another end portion of the lines extended, and the light-emitting elements within each group are electrically connected in series with one another by metallic wires and electrically connected in series with one another by metallic wires and electrically connected in series to the first connecting electrode ant to the second connecting electrode. The groups each include the same number of light-emitting elements that are electrically connected in parallel between the first connecting electrode and the second connecting electrode. (For reference, see Japanese Unexamined Patent Application Publication No. 2013-118292).

SUMMARY OF THE INVENTION

In a first aspect of the present inventive subject matter, a light source includes a substrate that includes a first electrode and a second electrode, and light-emitting elements arranged in an area and divided into groups each including a same number N of light-emitting elements that are electrically connected to one another in series in each group of the groups and that are electrically connected in series to the first electrode and to the second electrode of the substrate, and the light-emitting elements include a first light-emitting element that is configured to start emitting light when a voltage applied to the light-emitting elements exceeds a first voltage value, and the light-emitting elements except the first light-emitting element are configured to start emitting light when the voltage exceeds a second voltage value that is higher than the first voltage value.

In a second aspect of the present inventive subject matter, a lighting device includes a light source and a holder to which the light source is attached.

In a third aspect of the present inventive subject matter, a lighting device includes a light source that includes light-emitting elements electrically connected to one another, the light-emitting elements includes a first light-emitting element positioned at a center of an area in which the light-emitting elements are arranged, the lighting device further includes a light-transmitting cover arranged above the light source, the first light-emitting element is configured to start emitting light when a voltage applied to the light-emitting elements exceeds a first voltage value, the light-emitting elements except the first light-emitting element are configured to start emitting light when the voltage exceeds a second voltage value that is higher than the first voltage value, and the first light-emitting element is positioned on a center of the light-transmitting cover in a plan view.

It is disclosed that the first voltage value is a voltage value within a range of 80 percent to 90 percent of the second voltage value.

It is disclosed that the first light-emitting element may be positioned at a center of the area in an embodiment.

Also, it is disclosed that the first light-emitting element may be positioned adjacent to an edge of the area.

It is disclosed that the first light-emitting element may be positioned at a corner of the area.

Furthermore, it is disclosed that the light-transmitting cover may be a lens.

Means for positioning the light source on the holder is disclosed.

Also, means for positioning the light-transmitting cover with respect to the first light-emitting element of the light source.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, elements, components, portion of an element, and/or groups but do not preclude the presence or addition of one or more other features, integers, elements, components, portions, and/or groups thereof.

Relative terms such as "below" or "above" or "upper" or "lower" or "upward" or "downward" or "left" or "right" may be used herein to describe a relationship of one element, portion, surface, area, or direction to another element, portion, surface, area, or direction as illustrated in the figures. It will be understood that these terms are intended to encompass different orientations of a device in addition to the orientation depicted in the figures.

According to an embodiment of the present invention, a lighting device includes a light source. The light source includes light-emitting elements electrically connected to one another. The light-emitting elements include a first light-emitting element positioned at a center of light-emitting portion of the light source. The first light-emitting element is configured to start emitting light when a voltage applied to the light-emitting elements exceeds a first voltage value. The light-emitting elements except the first light-emitting element are configured to start emitting light when the voltage exceeds a second voltage value that is higher than the first voltage value.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature.

Figure 1:
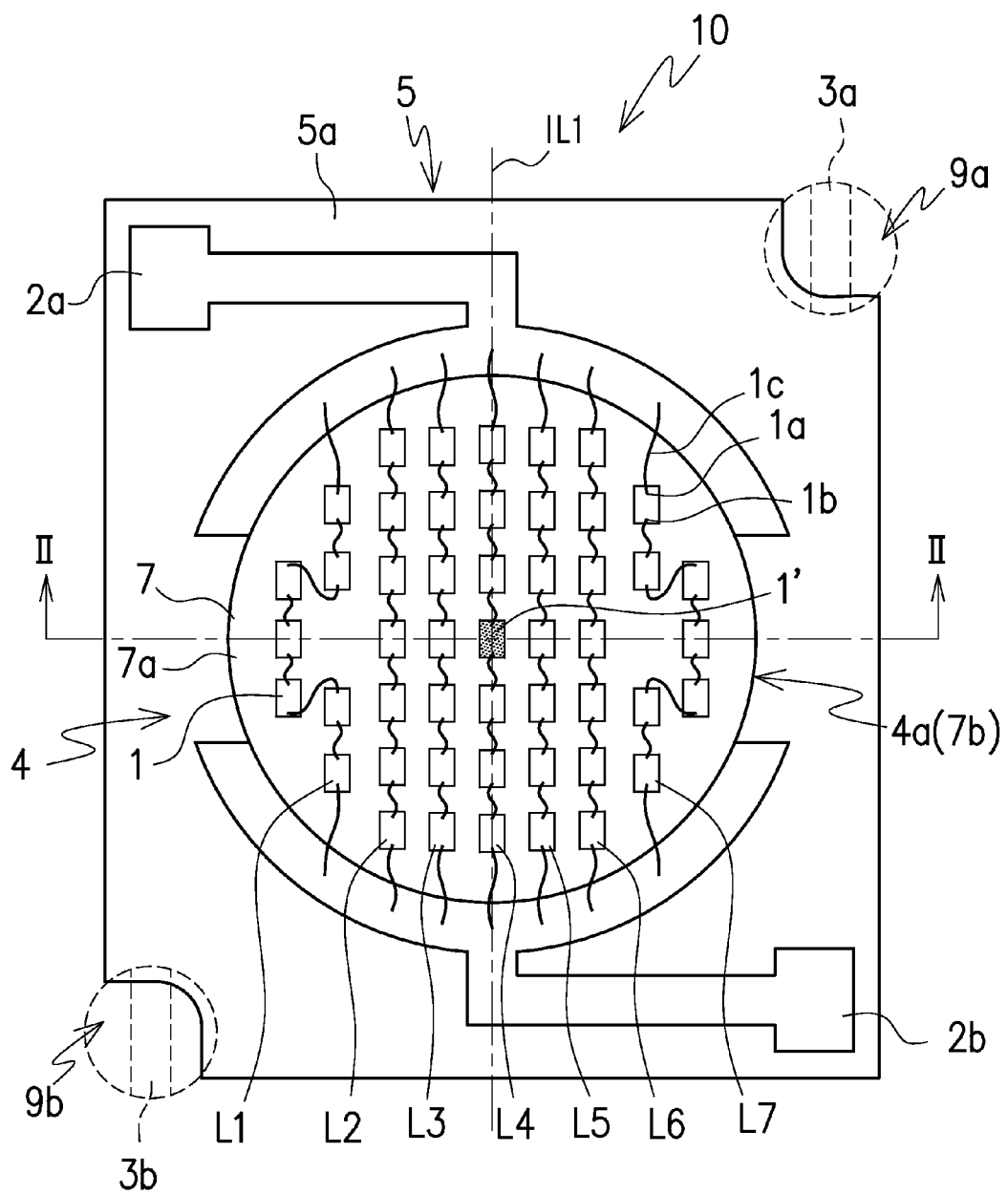
FIG. 1 is a plan view of a light source, which can be used as a light source of a lighting device, according to a first embodiment of the present invention.

FIG. 1 is a plan view of a light source, which can be used as a light source of a lighting device according to a first embodiment of the present invention. The light source 10 includes a substrate 5 that includes a first electrode 2a and a second electrode 2b arranged on an upper surface 5a of the substrate 5, and includes light-emitting elements 1 arranged in an area 4. The area 4 in which the light-emitting elements 1 of the groups L1-L7 are arranged may have a circular shape, square shape or a rectangular shape, for example, depending on the shape of a light-emitting portion of the light source. In this embodiment, the light-emitting elements 1 of groups L1, L2, L3, L4, L5, L6 and L7 are sealed and integrated with one another by a light-transmitting member 7 as shown in FIG. 1, the light-transmitting member 7 sealing the light-emitting elements 1 is configured to be the light-emitting portion of the light source 10. Accordingly, the area 4 coincides with the light-transmitting member 7 in this embodiment. The light-transmitting member 7 may be made of resin.

Also, the light-transmitting member 7 may include a phosphor 7a and/or reflective particle.

Even if the light-emitting elements 1 are sealed by the light-transmitting member 7 including a phosphor and/or reflective particle, it is possible to light only the first light-emitting element 1' among the light-emitting elements 1 while the voltage value supplied to the light source 10 is above the first voltage value and below the second voltage value. Accordingly, it is possible to recognize the center position of the light-emitting portion of the light source 10, because the first light-emitting element 1' can be lit when the voltage is above the first voltage value and below the second voltage value.

The area 4 coincides with a light-emitting portion of the light source 10. In this embodiment the area 4 has a circular shape. The substrate 5 includes a first cut portion 9a at a corner of the substrate 5 and a second cut portion 9b at a second corner of the substrate 5. In this embodiment, the first cut portion 9a at the first corner and the second cut portion 9b at the second corner are diagonally arranged. When the light source 10 is arranged in a lighting device, the light source 10 can be fastened at the first cut portion 9a by a first screw 3a and at the second cut portions 9b by a second screw 3b to the lighting device.

The light-emitting elements 1 are divided into groups L1-L7 each including a same number N of light-emitting elements that are electrically connected to one another in series in each group L1, L2, L3, L4, L5, L6 or L7 of the groups L1-L7. In this embodiment, the number N of light-emitting elements 1 is seven. The light-emitting elements 1 in each group L1, L2, L3, L4, L5, L6 or L7 are electrically connected in series to the first electrode 2a and to the second electrode 2b. The light-emitting elements 1 in each group are electrically connected in series to the first electrode 2a and to the second electrode 2b. The groups L1-L7 are arranged in parallel between the first electrode 2a and the second electrode 2b.

In this embodiment, seven light-emitting elements in each group L1, L2, L3, L4, L5, L6 or L7 are electrically connected by metallic wires 1c and electrically connected in series to the first electrode 2a at a first end of each group by a metallic wire 1c and to the second electrode 2b at a second end of each group by a metallic wire 1c. In this embodiment, electrical contact portions 1a and 1b of the light-emitting element 1 are positioned on the upper surface of the light-emitting element as a first electrical contact portion 1a and a second electrical contact portion 1b.

Accordingly, the electrical contact portions 1a and 1b of the light-emitting elements 1 in each group of the groups L1-L7 can be electrically connected to one another in series by metallic wires 1c, and one light-emitting element 1 adjacently positioned to the first electrode 2a in each group is electrically connected in series to the first electrode 2a by a metallic wire 1c and another light-emitting element 1 adjacently positioned to the second electrode 2b in each group of the groups L1-L7 is electrically connected in series to the second electrode 2b by a metallic wire 1c, as shown in FIG. 1.

If the electrical contact portions 1a and 1b of the light-emitting element 1 are positioned on the lower surface of the light-emitting element 1, the light-emitting element 1 may be mounted through bumps on an electrode pattern arranged on the upper surface 5a of the substrate 5. In this case, the electrode pattern are arranged adjacent to the light-emitting elements 1 in the area 4, and electrically connected to the first electrode 2a and the second electrode 2b.

The light-emitting elements 1 includes a first light-emitting element 1' that is configured to start emitting light when a voltage applied to the light-emitting elements 1 exceeds a first voltage value, and the light-emitting elements 1 except the first light-emitting element 1' are configured to start emitting light when the voltage exceeds a second voltage value that is higher than the first voltage value.

Accordingly, voltage can be supplied from one of the first electrode 2a and the second electrode 2b through all of the light-emitting elements 1 including the first light-emitting element 1' to the other of the first electrode 2a and the second electrode 2b. While the voltage applied to the light-emitting elements 1 is above a first voltage value and below the second voltage value, the first light-emitting elements 1' among the light-emitting elements 1 are configured to be lit. The first voltage value can be a voltage value within a range of 80 percent to 90 percent of the second voltage value.

Figure 2A:
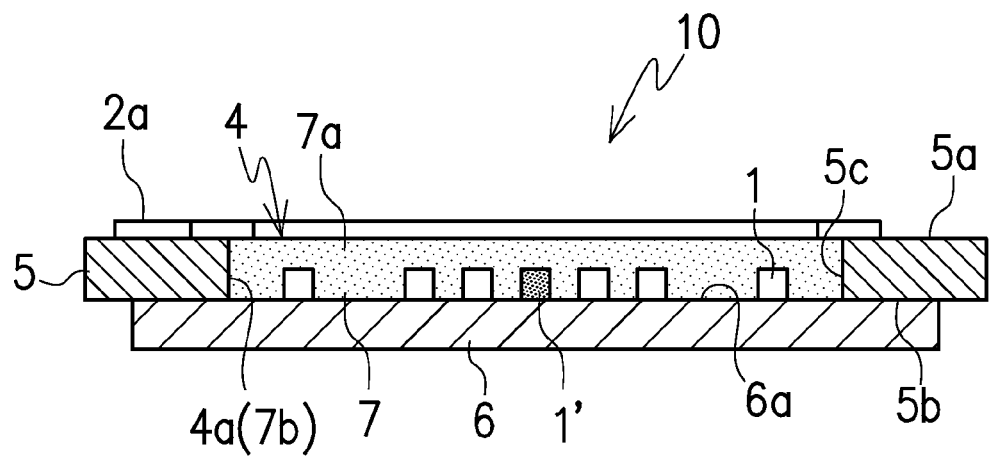
FIG. 2A is a cross-sectional view of the light source taken along a line II-II shown in FIG. 1, showing a first variation of substrate.

FIG. 2A shows a cross-sectional view of the light source 10 taken along a line II-II shown in FIG. 1, showing a first variation of a substrate 5 of the light source 10. The substrate 5 in this variation includes a pass-through hole 5c that passes the substrate 5 from an upper surface 5a to a lower surface 5b of the substrate 5. The substrate 5 may be made of resin. The substrate 5 including a first electrode 2a and a second electrode 2b is a circuit substrate. The light source 10 may further include a metal member 6 that is arranged in contact with the lower surface 5b of the substrate 5. The light-emitting elements 1 in groups L1-L2 can be arranged on an upper surface 6a of the metal member 6 within the pass-through hole 5c of the substrate 5. In this variation, a peripheral side surface of the substrate demarcating the pass-through hole 5c coincides with a peripheral edge 4a of the area 4 and also coincides with a peripheral side surface 7b of the light-transmitting member in this embodiment.

In the first variation of the substrate 5, the first electrode 2a includes an electrode portion arranged adjacent to the pass-through hole 5c partly along the pass-through hole 5c of the substrate 5. Also, the second electrode 2b includes an electrode portion arranged adjacent to the pass-through hole 5c partly along the pass-through hole 5c of the substrate 5. The electrode portion of the first electrode 2a and the electrode portion of the second electrode 2b are arranged on the upper surface 5a of the substrate 5 and positioned opposite to each other across the pass-through hole 5c of the substrate 5.

Figure 2B:
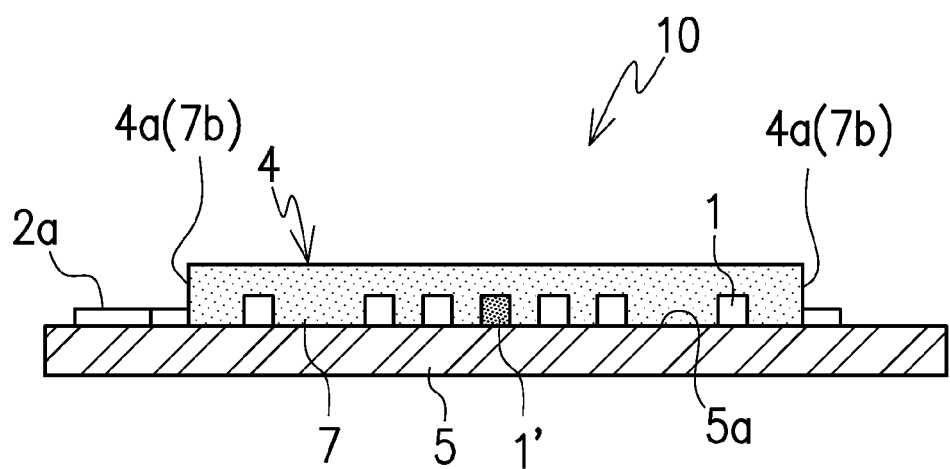
FIG. 2B is a cross-sectional view of the light source taken along a line II-II shown in FIG. 1, showing a second variation of substrate.

FIG. 2B is a cross-sectional view of the light source taken along a line II-II shown in FIG. 1, showing a second variation of substrate.

In the second variation of the substrate, the light-emitting elements 1 can be mounted on a substrate 5 and electrically connected to the first electrode 2a and the second electrode 2b that are arranged on the substrate 5. The substrate 5 in this variation may be a ceramic substrate.

The light-emitting elements 1 except the first light-emitting element 1' are configured to start emitting light when the voltage exceeds the second voltage value higher than the first voltage value. The light-emitting elements 1 that are configured to start emitting light when the voltage exceeds the second voltage value are herein explained as second light-emitting elements.

In this variation, a peripheral edge 4a of the area 4 coincides with a peripheral side surface 7b of the light-transmitting member 7.

Figure 3:
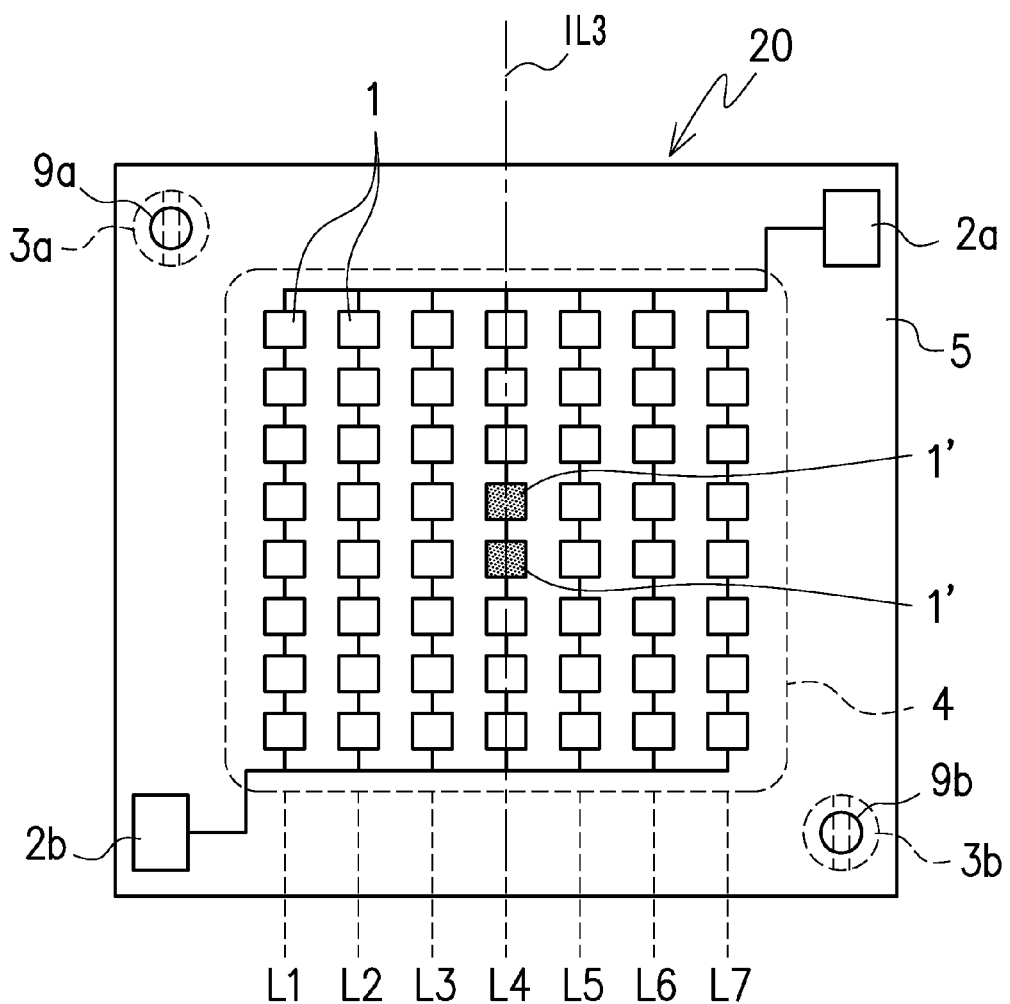
FIG. 3 is a schematic plan view of a light source according to a second embodiment of the present invention.

FIG. 3 is a schematic plan view of a light source 20, which can be used as a light source of a lighting device, e according to a second embodiment of the present invention. Electrical connection of the light-emitting elements 1 and the first electrode 2a and the second electrode 2b are shown simplified.

In this embodiment, the number of light-emitting elements 1 that are electrically connected to one another in series in each group of the groups L1, L2, L3, L4, L5, L6 and L7 is eight as the same number N of the light-emitting elements 1 in each group. The number N of the light-emitting elements 1 which are electrically connected to one another in series in each group L1, L2, L3, L4, L5, L6 or L7 is not limited to the number example explained herein as embodiments of the present invention. The number N of the light-emitting elements can be set in relation to voltage value which is available, and in relation to the number of groups each including N light-emitting elements, considering a shape and/or size of the area, for example.

The words "the center of the area" may include a central portion of the area 4, when the number N of the light-emitting elements 1 in each group is an even number.

In this case, it is possible to arrange two or more light-emitting elements 1 as the first light-emitting elements 1' in one or more groups. In this embodiment, two first light-emitting elements 1' are positioned in the central portion of the group L4 which is arranged on a center line of the area 4 in a plan view among the groups L1-L7. The one-dotted chain line IL3 shows the center line which divides the area 4 into two equal portions as a first portion which is the left part and a second portion which is the right part of the area 4 as shown in FIG. 3. The one-dotted chain line IL3 is an imaginary line.

Accordingly, since the two first light-emitting elements 1' are positioned in the central portion of the area 4, it is possible to recognize the central portion of the light-emitting portion of the light source 10, even if hundreds of light-emitting elements 1 are arranged and/or even if the light-emitting elements 1 are sealed by a light-transmitting resin 7 including a phosphor 7a and/or reflective particle. In this embodiment, the substrate 5 includes a first hole 9a adjacent to a first corner of the substrate 5 and a second hole 9b adjacent to a second corner of the substrate 5. When the light source 20 is arranged in a lighting device, the light source 20 can be fastened at the first hole 9a by a first screw 3a and at the second hole 9b by a second screw 3b to the lighting device. The screws 3a and 3b are shown as dotted line in FIG. 3.

In this embodiment, the area 4 in which the light-emitting elements 1 of the groups L1-L7 are arranged has a square shape.

Figure 4:
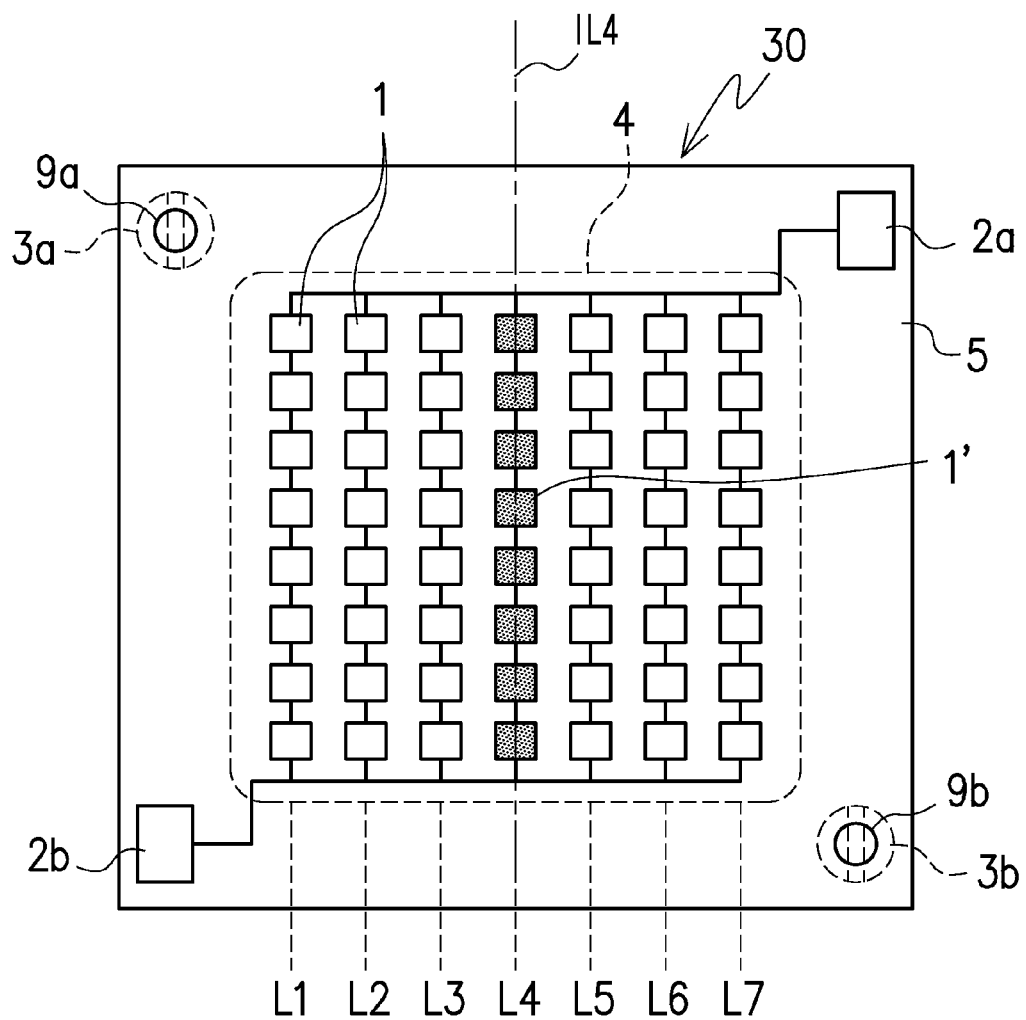
FIG. 4 is a schematic plan view of a light source according to a third embodiment of the present invention.

FIG. 4 is a schematic plan view of a light source 30, which can be used as a light source of a lighting device, according to a third embodiment of the present invention.

In this embodiment, all of the light-emitting elements 1 arranged in the group L4 which is positioned on a center line of the area 4 among the groups L1-L7 are the first light-emitting elements 1'. In this embodiment, the first light-emitting elements 1' are arranged on the center line which is shown as an imaginary line IL4 dividing the area 4 into two equal portions as a first portion which is the left part and a second portion which is the right part. The imaginary line IL4 shown in FIG. 4 runs on a center of the area 4, shown as the line passing through all of the first light-emitting elements 1' positioned in the center group L4 in a plan view. When a voltage applied to the light-emitting elements 1 exceeds a first voltage value, the first light-emitting elements 1' arranged on the center line IL4 are configured to start emitting light.

In this embodiment, even if the light-emitting elements 1 are sealed by a light-transmitting member 7 that may include a phosphor and/or reflective particle, it is possible to light only the first light-emitting element 1' arranged on the center line of the light-emitting portion 4 of the light source 30.

Figure 5:
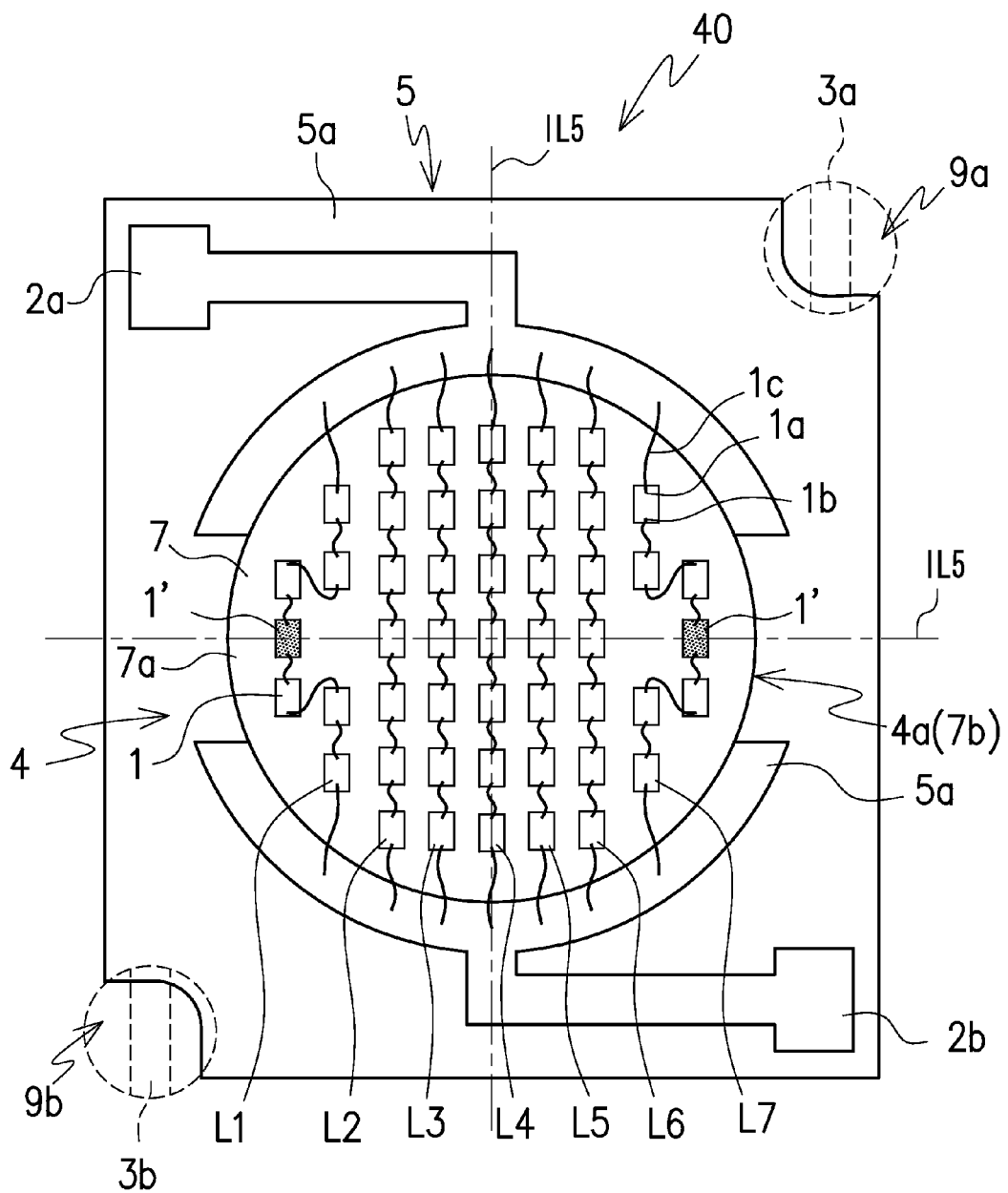
FIG. 5 is a plan view of a light source according to a fourth embodiment of the present invention.

FIG. 5 is a plan view of a light source 40 according to a fourth embodiment of the present invention. It is possible to arrange a first light-emitting element 1' arranged in group L1 and/or group L7 which is arranged adjacent to an edge of the area 4. In this embodiment, the first light-emitting element 1' is positioned on a center line which is shown as an imaginary line IL5 dividing the area 4 into two equal portions: a first portion at a side where the first electrode 2a is positioned and a second portion at a side where the second electrode 2b is positioned. The imaginary line IL5 shown in FIG. 5 runs on a center of the area 4, passing through the light-emitting elements positioned at the center of each group of the groups L1-L7 in a plan view.

In this embodiment, even if hundreds of light-emitting elements 1 are arranged and/or even if the light-emitting elements 1 are sealed by a light-transmitting member 7 that may be made of transparent or translucent resin and include a phosphor and/or reflective particle, it is possible to light only the first light-emitting elements 1' arranged in a group L1 and/or L7 positioned adjacent to an edge of the area 4.

Furthermore, it is possible to arrange the first light-emitting element 1' which is positioned at the center of the area as shown in FIG. 1, in addition to the first light-emitting elements 1' arranged in groups L1 and L7 that are positioned adjacent to a circular edge of the area 4 shown in FIG. 5.

Figure 6:
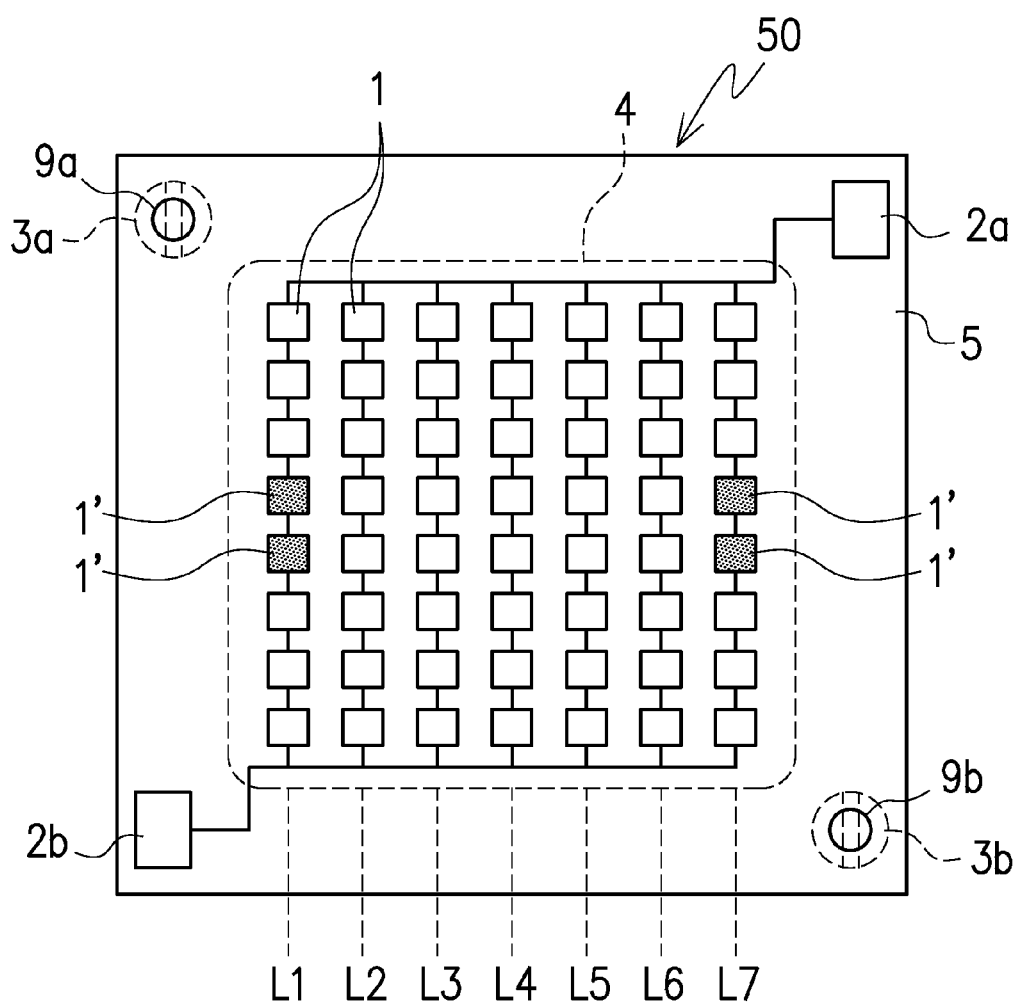
FIG. 6 is a schematic plan view of a light source according to a fifth embodiment of the present invention.

FIG. 6 is a schematic plan view of a light source 50 according to a fifth embodiment of the present invention. In this embodiment, two or more first light-emitting elements 1' can be arranged in group L1 and/or group L7 which is arranged adjacent to an edge of the area 4, which is a light-emitting portion of the light source 50.

Figure 7:
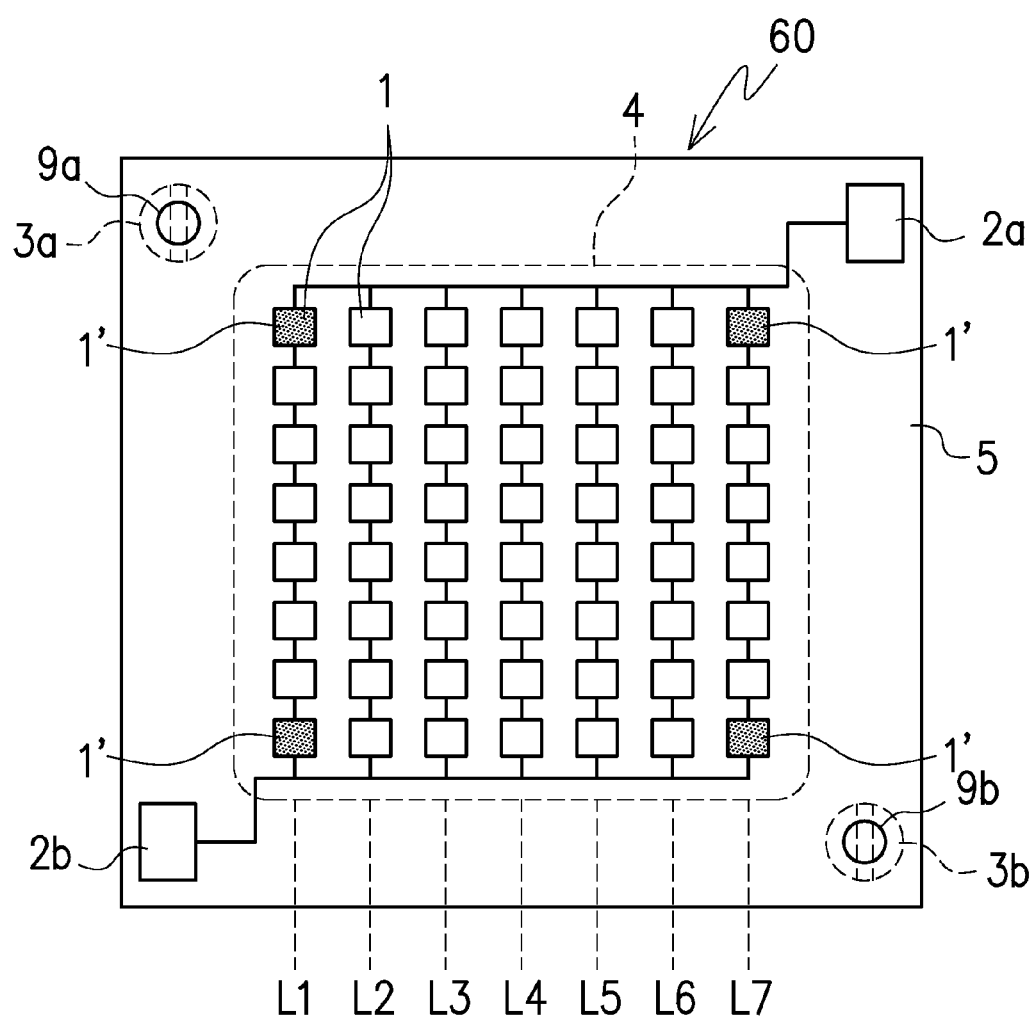
FIG. 7 is a schematic plan view of a light source according to a sixth embodiment of the present invention.

FIG. 7 is a schematic plan view of a light source 60 according to a sixth embodiment of the present invention. A first light-emitting element 1' can be arranged at a corner of the area 4. In this embodiment, the first light-emitting elements 1' are arranged at four corners of the area 4.

Figure 8:
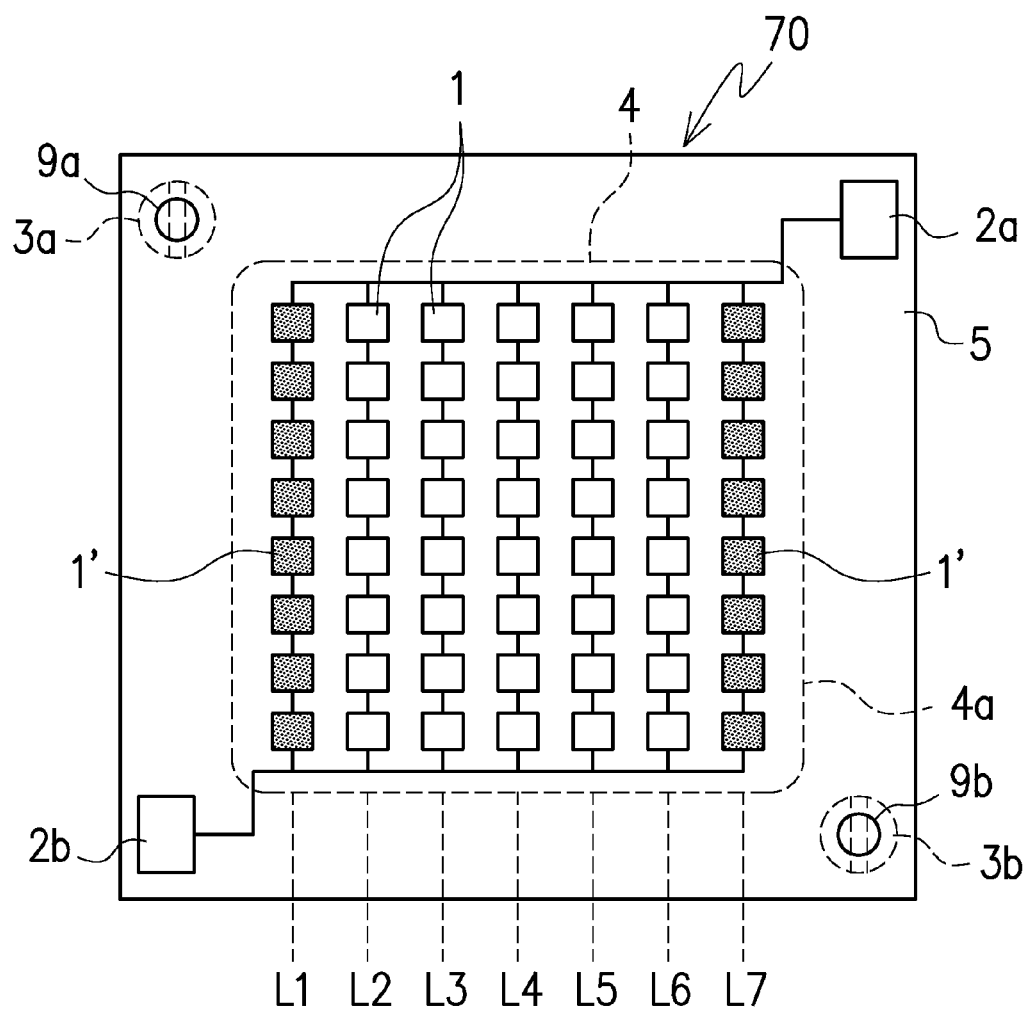
FIG. 8 is a schematic plan view of a light source according to a seventh embodiment of the present invention.

FIG. 8 is a schematic plan view of a light source 70 according to a seventh embodiment of the present invention.

It is possible to arrange first light-emitting elements 1' in a line. All of the light-emitting elements 1 arranged in a group in a line may be first light-emitting elements 1'. In this embodiment, all of the light-emitting elements 1 arranged in a line in group L1 adjacent to the edge of the area 4 and all of the light-emitting elements 1 arranged in a line in group L7 are first light-emitting elements 1'.

Figure 9:
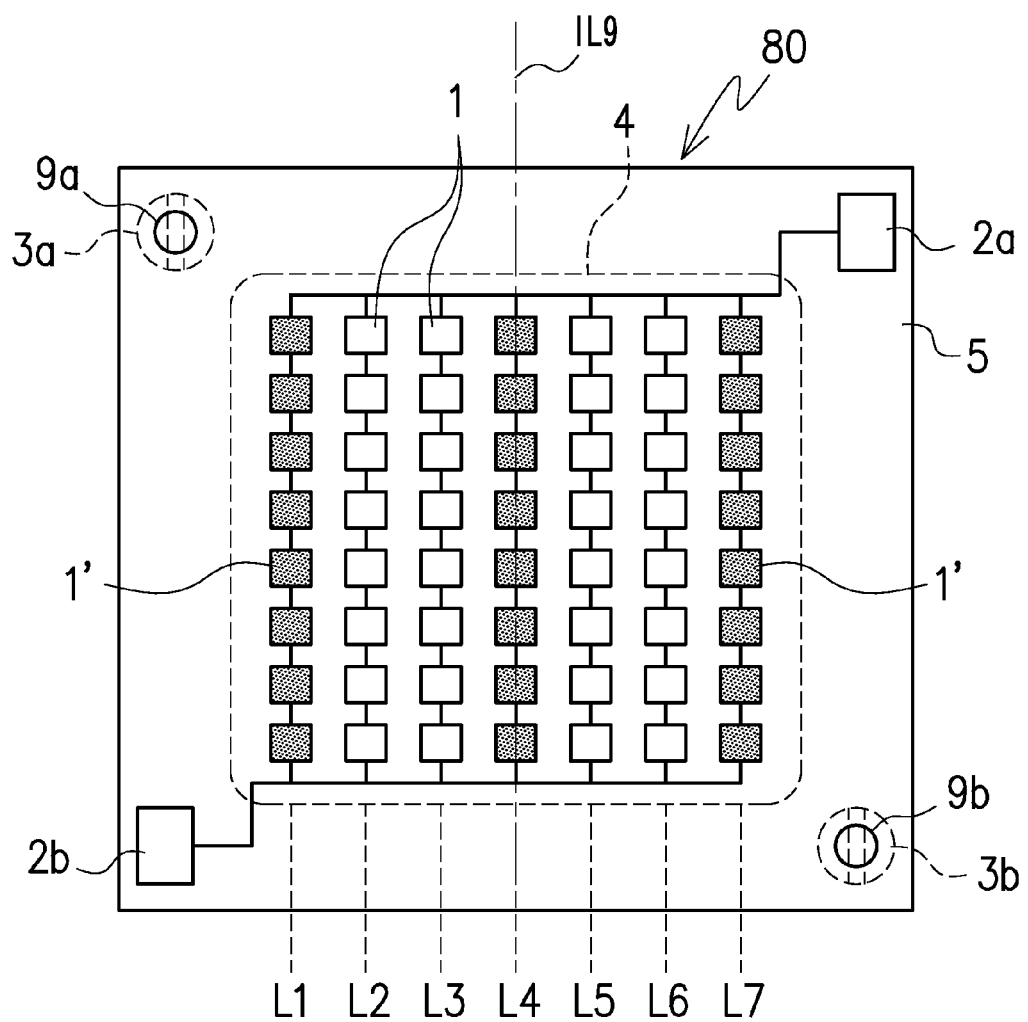
FIG. 9 is a schematic plan view of a light source according to an eighth embodiment of the present invention.

FIG. 9 is a schematic plan view of a light source 80 according to an eighth embodiment of the present invention.

In this embodiment, the first light-emitting elements 1' in the group L4 which are arranged on a center line which is shown as an imaginary line IL9 dividing the area 4 into two equal portions. The imaginary line IL9 shown in FIG. 9 runs on the center of the area 4, passing through the light-emitting elements arranged in the group L4 positioned on the center line. In this embodiment, the group L4 positioned on the center line IL9 and the groups L1 and L7 positioned laterally opposite ends of the arranged groups L1-L7 shown in FIG. 9. The first light-emitting elements 1' in this embodiment can be lighted as three light-emitting lines when a voltage applied to all of the light-emitting elements 1 exceeds a first voltage value, which is below a second voltage value.

Figure 10:
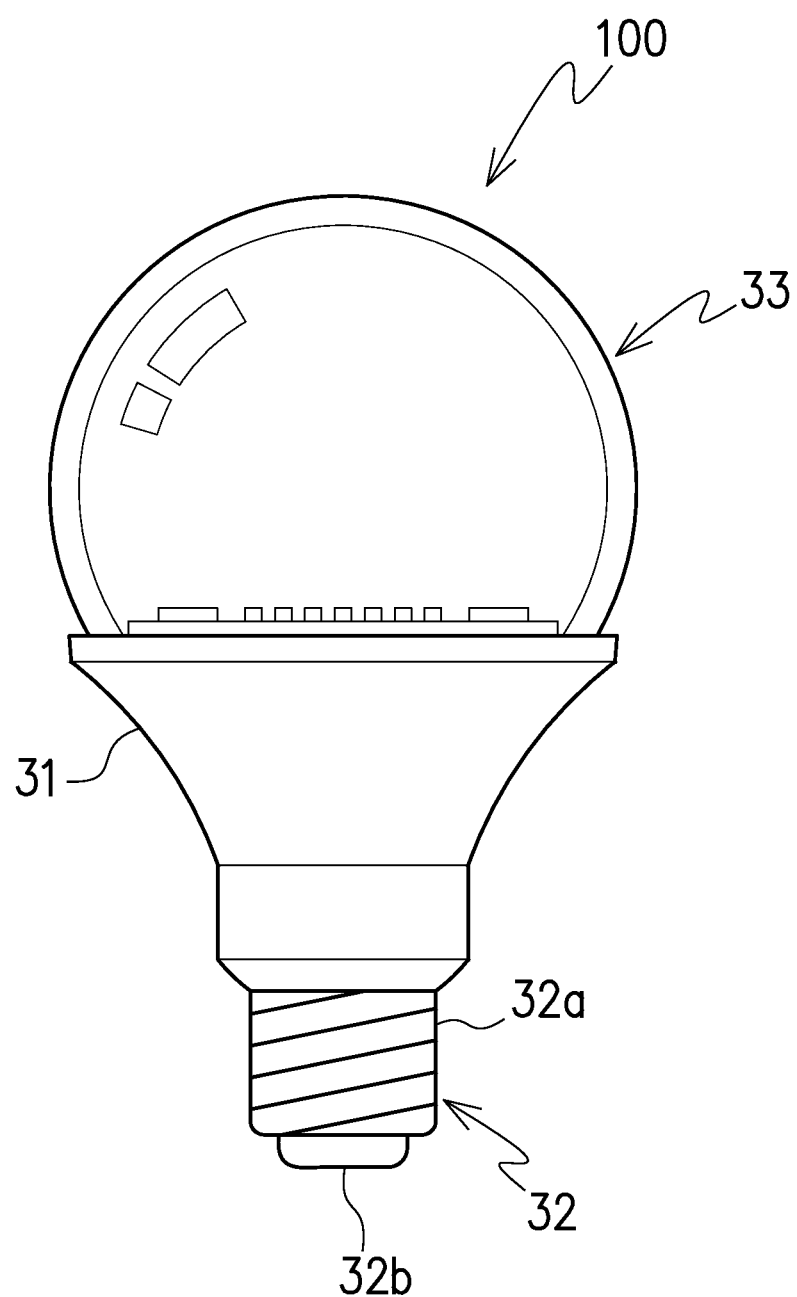
FIG. 10 is a front view of a lighting device according to a ninth embodiment of the present invention. The lighting device may include a light source according to an embodiment explained herein.

FIG. 10 is a front view of a lighting device according to a ninth embodiment of the present invention. The lighting device 100 in this embodiment may include a light source according to an embodiment explained herein. The lighting device 100 includes a light source including a substrate 5 with a first electrode 2a and a second electrode 2b, light-emitting elements 1 arranged in an area 4 and divided into groups L1-L7 each including a same number N of light-emitting elements 1a-1h that are electrically connected to one another in series in each group L1, L2, L3, L4, L5, L6 or L7 of the groups and that are electrically connected in series to the first electrode 2a and to the second electrode 2b of the substrate 5.

The light-emitting elements 1 includes a first light-emitting element 1d' that is configured to start emitting light when a voltage applied to the light-emitting elements 1 exceeds a first voltage value, and the light-emitting elements 1 except the first light-emitting element 1d' are configured to start emitting light when the voltage exceeds a second voltage value that is higher than the first voltage value.

The first voltage value is a voltage value within a range of 80 percent to 90 percent of the second voltage value. The first light-emitting element may be positioned at a center of the area, as shown in FIG. 1.

Also, as shown in FIG. 3, the center of the area 4 may include central portion of the area 4. If the number of the light-emitting elements in each group is an even number, two light-emitting elements positioned in the central portion of the area 4 may be chosen as the first light-emitting elements.

The lighting device 100 further includes a holder 31 housing a control circuit 34 and holding the light source 80, a bayonet cap 32 that is positioned under the holder 31 and includes a pair of terminals 32a and 32b. Voltage can be supplied to the lighting device 100 through the terminals 32a and 32b of the bayonet cap 32 from outside. The control circuit 34 of the lighting device 100 is configured to supply the voltage to the first electrode 2a and the second electrode 2b arranged of the substrate 5 of the light source 80.

The lighting device 100 further includes a light-transmitting cover 33. The light-transmitting cover may include a curved surface. The light-transmitting cover 33 may be made of glass and/or resin. In this embodiment, the light-transmitting cover 33 includes a hemispherical shape.

Figure 11:
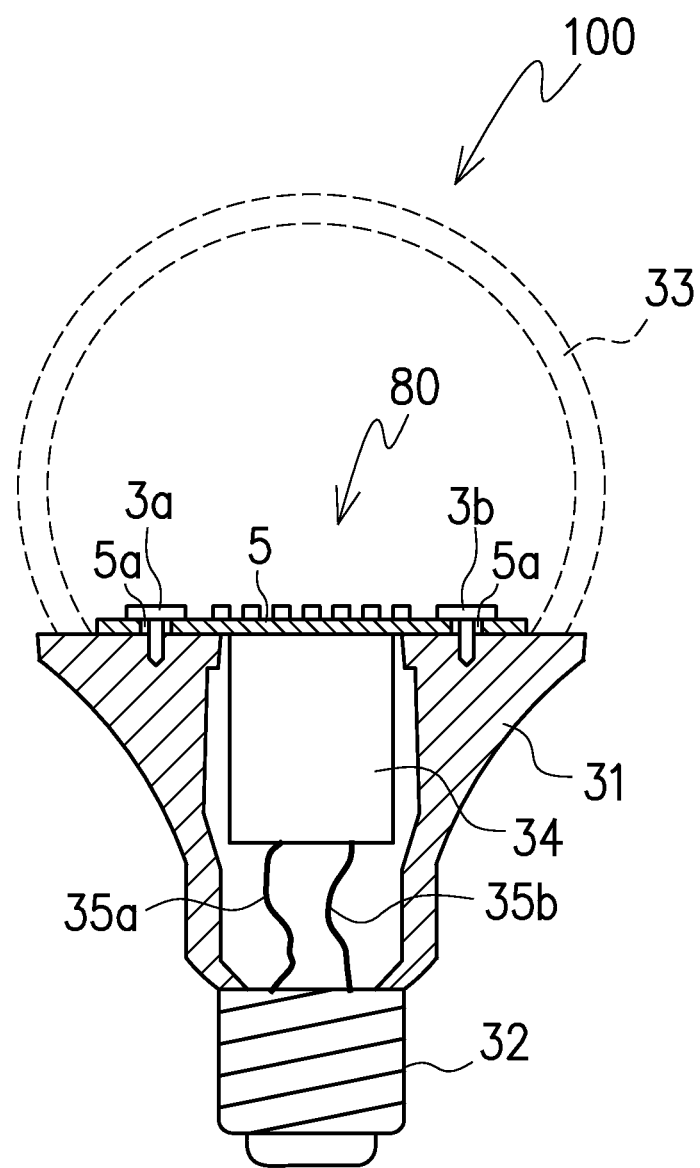
FIG. 11 shows a cross-sectional view of power-supply part of the lighting device shown in FIG. 9 with a light-transmitting cover (shown in FIG. 11 as a dotted line) removed. The power-supply part includes the light source, a holder 31 housing a control circuit 34 and holding the light source at a top portion of the holder. The bayonet cap 32 is not shown as a cross-sectional view but as a front view.

FIG. 11 shows a cross-sectional view of a power-supply part of the lighting device 100 shown in FIG. 9 with a light-transmitting cover 33 removed. The light-transmitting cover 33 is shown in a dotted line. The power-supply part includes the light source 80, a holder 31 housing a control circuit 34 and holding the light source 80 of the eighth embodiment as an example at a top portion of the holder 31, a bayonet cap 32, and a pair of electric connection cords 35a and 35b electrically connecting the control circuit 34 and the bayonet cap 32. The bayonet cap 32 is not shown as a cross-sectional view but shown as a front view in FIG. 11. The light source 80 is attached to the holder 31. The light source 80 can be fastened to the upper portion of the holder 31 by screws 3a and 3b through the first hole 9a and the second hole 9b of the substrate 5.

Figure 12:
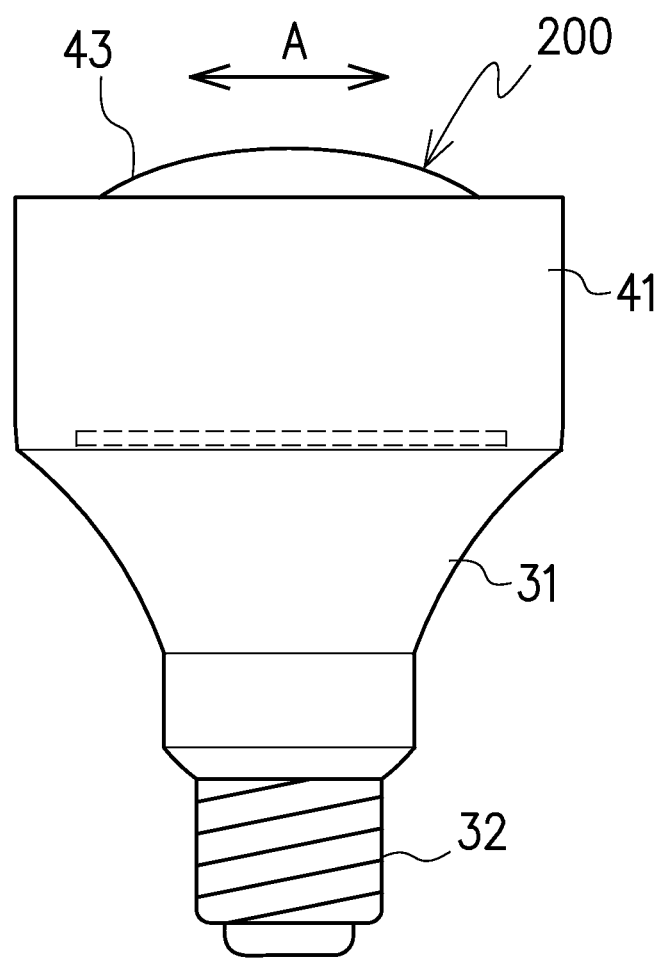
FIG. 12 is a front view of a lighting device according to a tenth embodiment of the present invention. The lighting device may include a light source according to an embodiment.

FIG. 12 is a front view of a lighting device according to a tenth embodiment of the present invention. This is another variation of lighting device. The lighting device 200 may include a light source according to an embodiment.

For example, the lighting device 200 includes a light source 10 including light-emitting elements 1 electrically connected to one another. The light-emitting elements 1 include a first light-emitting element 1' which is positioned at a center of an area 4. The area 4 is a light-emitting portion of the light source 10. The lighting device 200 may include a holder 31 to which the light source is attached. The first light-emitting element 1' is configured to start emitting light when a voltage applied to the light-emitting elements exceeds a first voltage value, and the light-emitting elements 1 except the first light-emitting element 1' are configured to start emitting light when the voltage exceeds a second voltage value that is higher than the first voltage value. The first voltage value is a voltage value within a range of 80 percent to 90 percent of the second voltage value.

The lighting device further includes a light-transmitting cover 43 arranged above the light source. The first light-emitting element 1' is positioned on a center of the light-transmitting cover 43 in a plan view.

The light-transmitting cover may be a lens. The light-transmitting cover 43 may be a condenser lens.

Accordingly, the lighting device 200 further includes a condenser lens 43 that is configured to collect light emitted from the light-emitting elements 1 of the light source 10.

Figure 13:
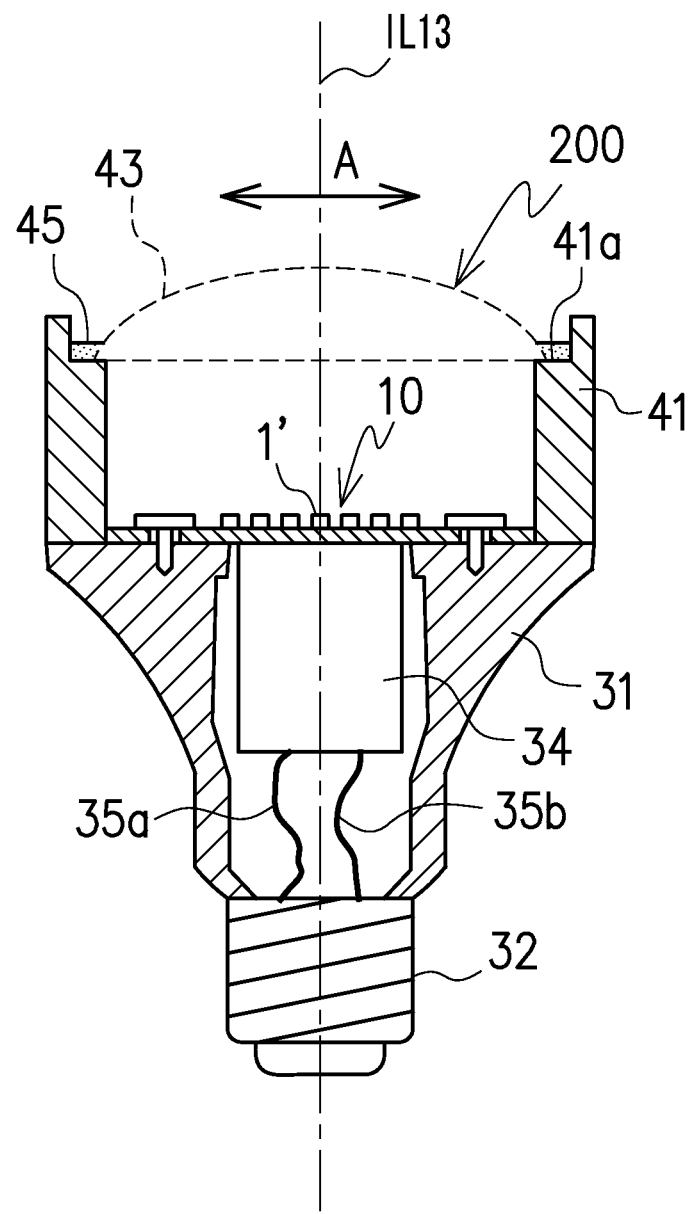
FIG. 13 shows a cross-sectional view of power-supply part of the lighting device shown in FIG. 10 with a light-transmitting cover (lens) removed. The power-supply part includes the light source, a holder 31 housing a control circuit 34 and holding the light source at a top portion of the holder. The holder 31 may include a ring-shaped support 41 positioned around the light source.

FIG. 13 shows a cross-sectional view of a power supply part of the lighting device 200 shown in FIG. 12 with a light-transmitting cover (lens) 43 removed.

The first light-emitting element 1' is positioned on a center of the lens 43 in a plan view. The center line IL3, which is an imaginary line, passes through the center of the lens 43.

The power supply part includes a light source 10 as an example, a holder 31 housing a control circuit 34 and holding the light source 10 at a top portion of the holder 31. The holder 31 may include a ring-shaped support 41 positioned around the light source 10. The ring-shaped support 41 may include a step portion 41a on which a peripheral portion of the lens 43 can be supported. The step portion 41a of the ring-shaped support 41 overlaps with the peripheral portion 45 of the lens 43 in a plan view. An outer edge of the step portion 41a of the support 41 is positioned outside of an outer edge of the step portion 41a of the ring-shaped support 41 in a plan view. The step portion 41a of the ring-shaped support 41 has a larger area than the peripheral portion 45 of the lens 43 has. Accordingly, it is possible to adjust the position of the lens 43 with respect to the first light-emitting element 1' of the light source.

For example, under a manufacturing process before the peripheral portion 45 of the lens 43 is adhered to the step portion 41a of the ring-shaped support 41, it is possible to shift the lens 43 in radial directions A to adjust the center of the lens with respect to the position of the first light-emitting element 1' of the light source 10. The center line IL13 in FIG. 13 shows an imaginary line which runs the center of the lens 43, the center of the light-emitting portion of the light source, and the center of the lighting device.

Figure 14:
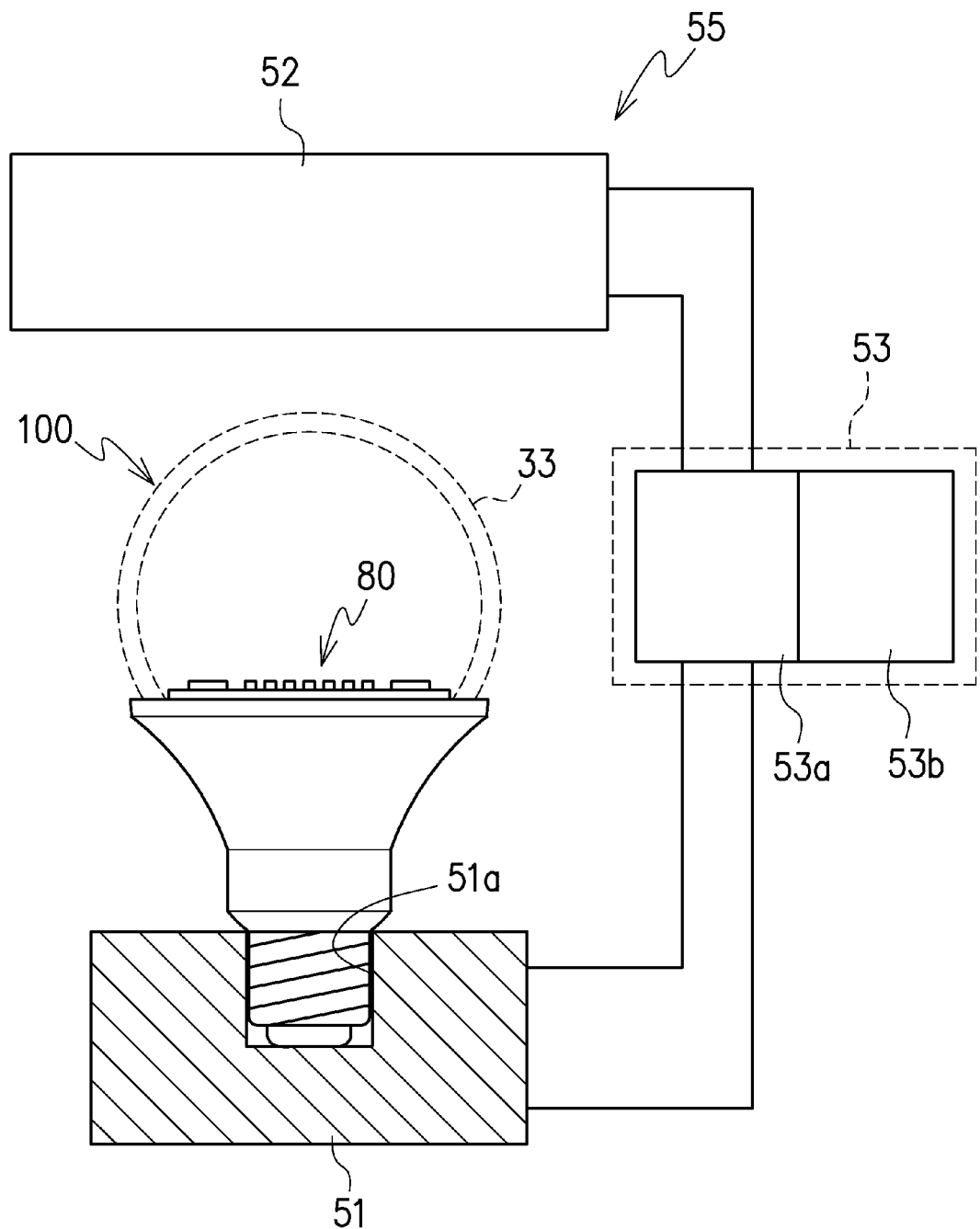
FIG. 14 shows a schematic view when a light source 80 arranged in a lighting device 100 under a manufacturing process of the lighting device 100, for example.

FIG. 14 shows a schematic view when a light source 80 is arranged in a lighting device 100 under a manufacturing process of the lighting device 100, for example. It will be explained about how the position of a light source can be adjusted in a lighting device.

A position-detection apparatus 55 may include a base 51 to hold the lighting device 100, a position-detection device 52 arranged above the light source 80 arranged in the lighting device 100, and a voltage-supply device 53 which can supply voltage exceeding the first voltage value but below the second voltage value. The voltage-supply device 53 includes a control part 53a and a display part 53b. The display part 53b includes a positioning mark. The positioning mark is used to align the light source 80 in the lighting device 100. The positioning mark may be a dot, a line, a bracket, and/or a frame, for example. The base 51 includes a socket fitting 51a in which the bayonet cap 32 of the lighting device 100 can be set.

Figure 15:
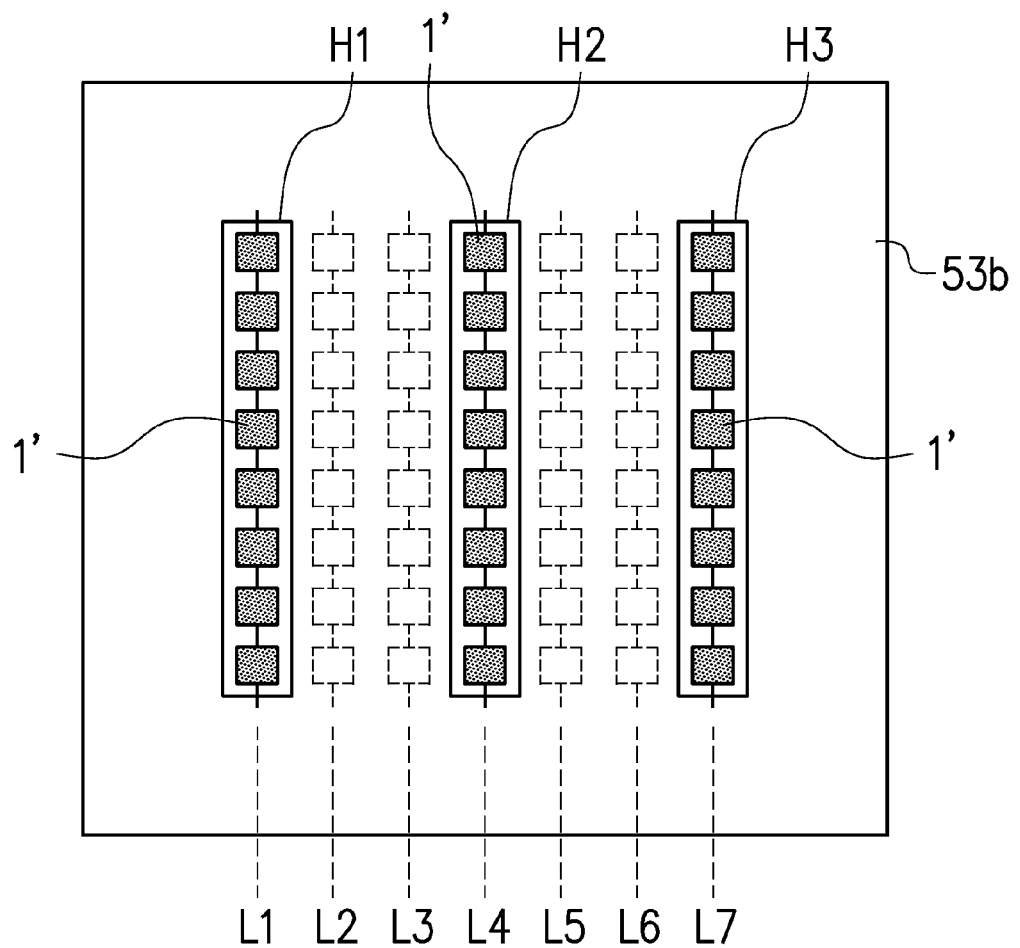
FIG. 15 shows a schematic view to show three groups of light-emitting elements being aligned in three positioning frames of the position-detection apparatus.

FIG. 15 shows a schematic view to show the display part 53b, showing three rectangular frames H1, H2, and H3 each in which the first light-emitting elements 1' in each group of the groups L1, L4 and L7 are positioned. The group L4 is arranged on a center line dividing the light-emitting portion of the light source into two equal portions as a first portion which is the left part and a second portion which is the right part of the light-emitting portion.

After the first light-emitting elements 1' in the groups L1, L4, and L7 are recognized to be aligned at a right position in the frames, the light source 80 positioned in a right place in the lighting device 100 can be fastened by the screws 3a and 3b to the holder 31 of the lighting device 100.

Figure 16:
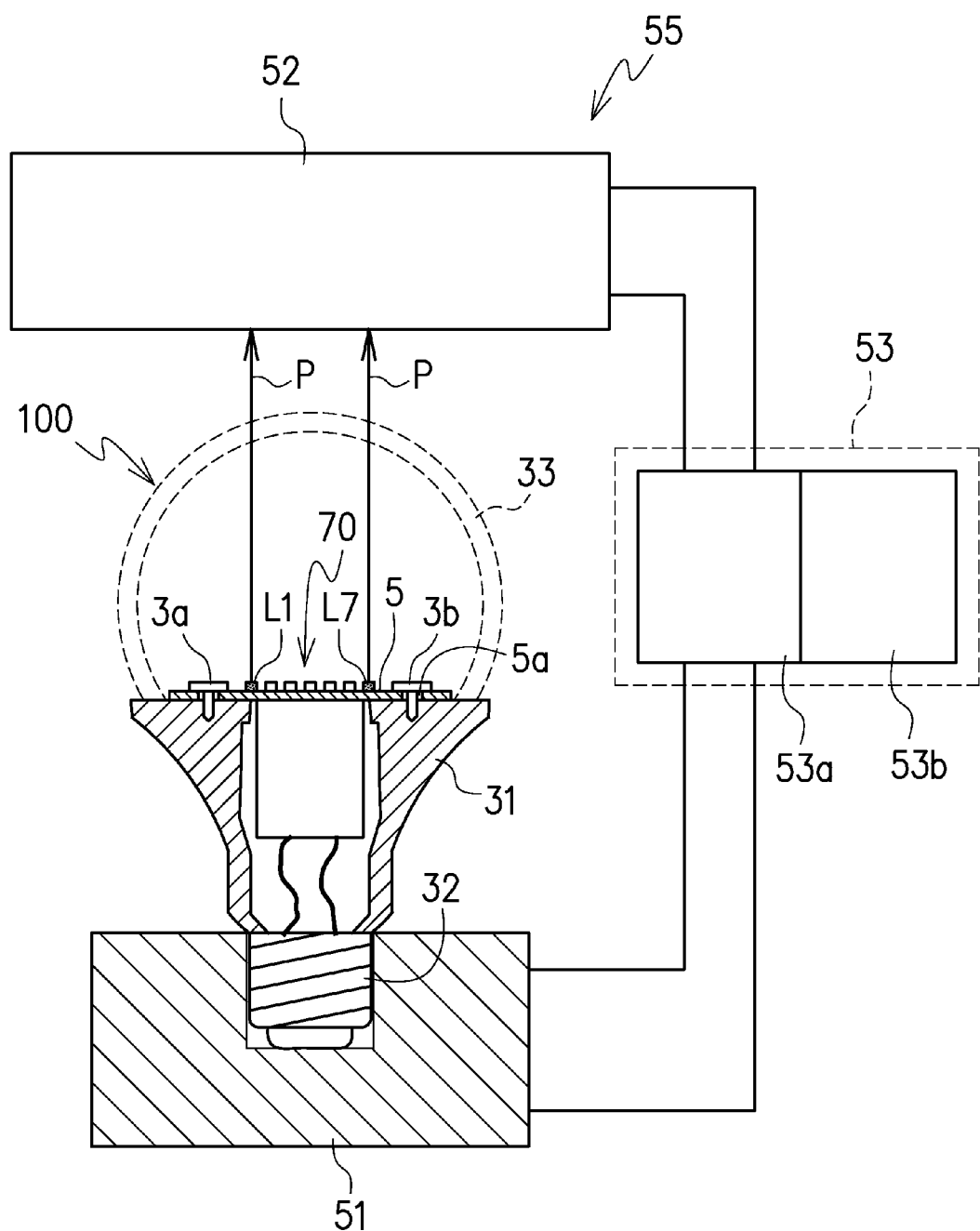
FIG. 16 shows an explanatory schematic view when a light source is positioned in a lighting device with use of position-detection apparatus.

FIG. 16 shows an explanatory schematic view when a light source 70 is positioned in a lighting device 100 with use of position-detection apparatus 55. When the first light-emitting elements 1' in the group L1 and group L7 are lit, the position-detection device 52 detects light P and the position of the first light-emitting elements 1'.

Figure 17:
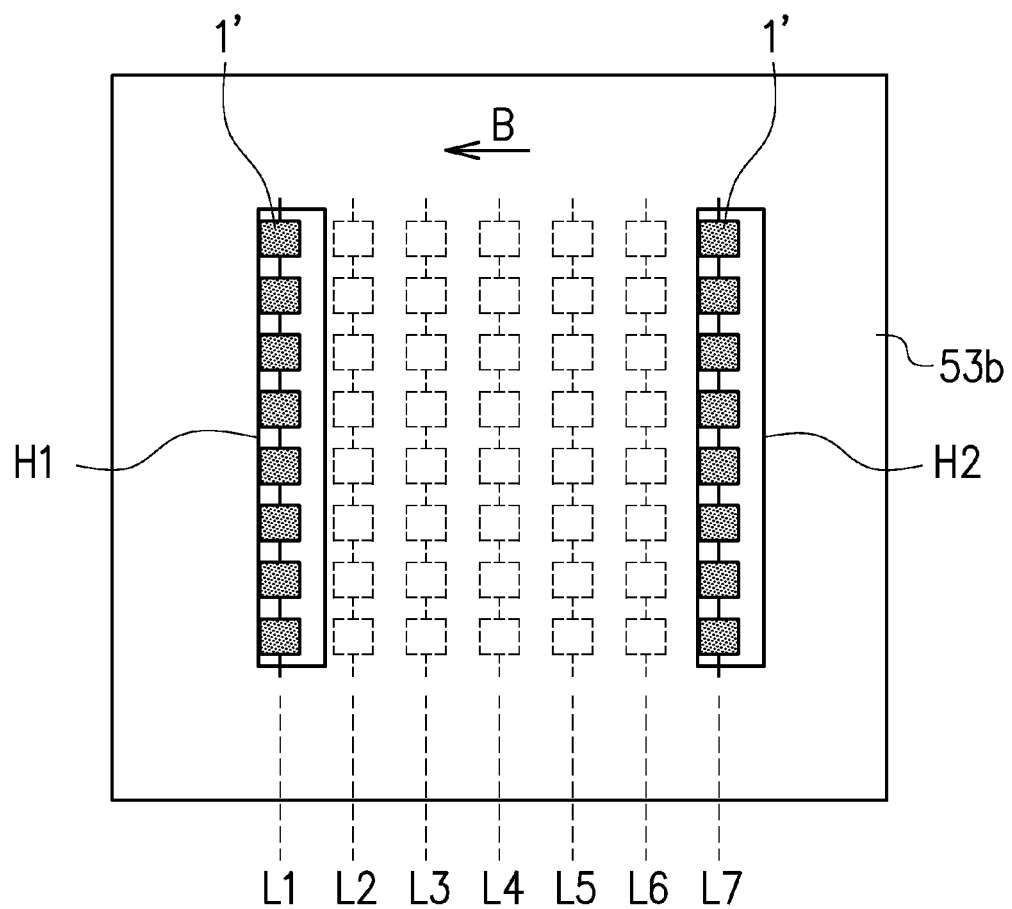
FIG. 17 shows a schematic view to show two groups L1, L7 of light-emitting elements being out of alignment as an example.

FIG. 17 shows a schematic view to show the display part 53b with two rectangular frames as the positioning mark: the first frame H1 and the second frame H2. If the first light-emitting elements 1' of the group L1 are shown as positioned too far left (in a direction shown as arrow B), the gap of position can be recognized as shown in the display part 53b.

Figure 18:
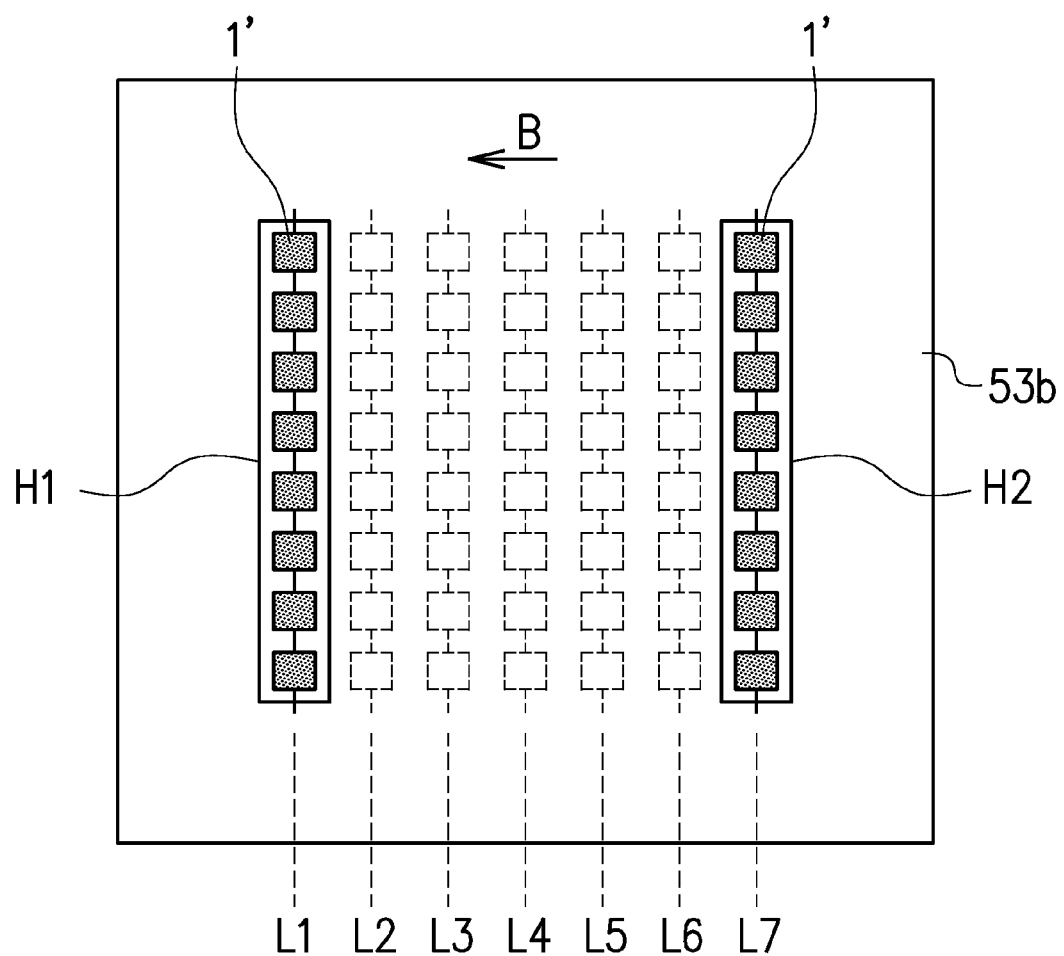
FIG. 18 shows a schematic view to show of light-emitting elements in two groups L1, L7 being aligned in two positioning frames of the position-detection apparatus. A positioning frame may be a positioning line, instead.

FIG. 18 shows a schematic view to show the display part 53b after the position of the light source is corrected so that the first light-emitting elements 1' of the group L1 are aligned in the first positioning frame H1 and the first light-emitting elements 1' of the group L7 are aligned in the second positioning frame H2. When the position of the light source is finalized, the light source can be fastened to the holder 31 by screws 3a and 3b at a right position.

The two groups L1 and L7 are positioned at laterally opposite ends of the groups adjacent to an edge of the area 4.

FIG. 18 shows a schematic view to show light-emitting elements in two groups L1 and L7 being aligned on a center in each of the two positioning frames H1 and H2 of the display part 53b included in the position-detection apparatus 55. A positioning frame may be a positioning line, instead.

Figure 19:
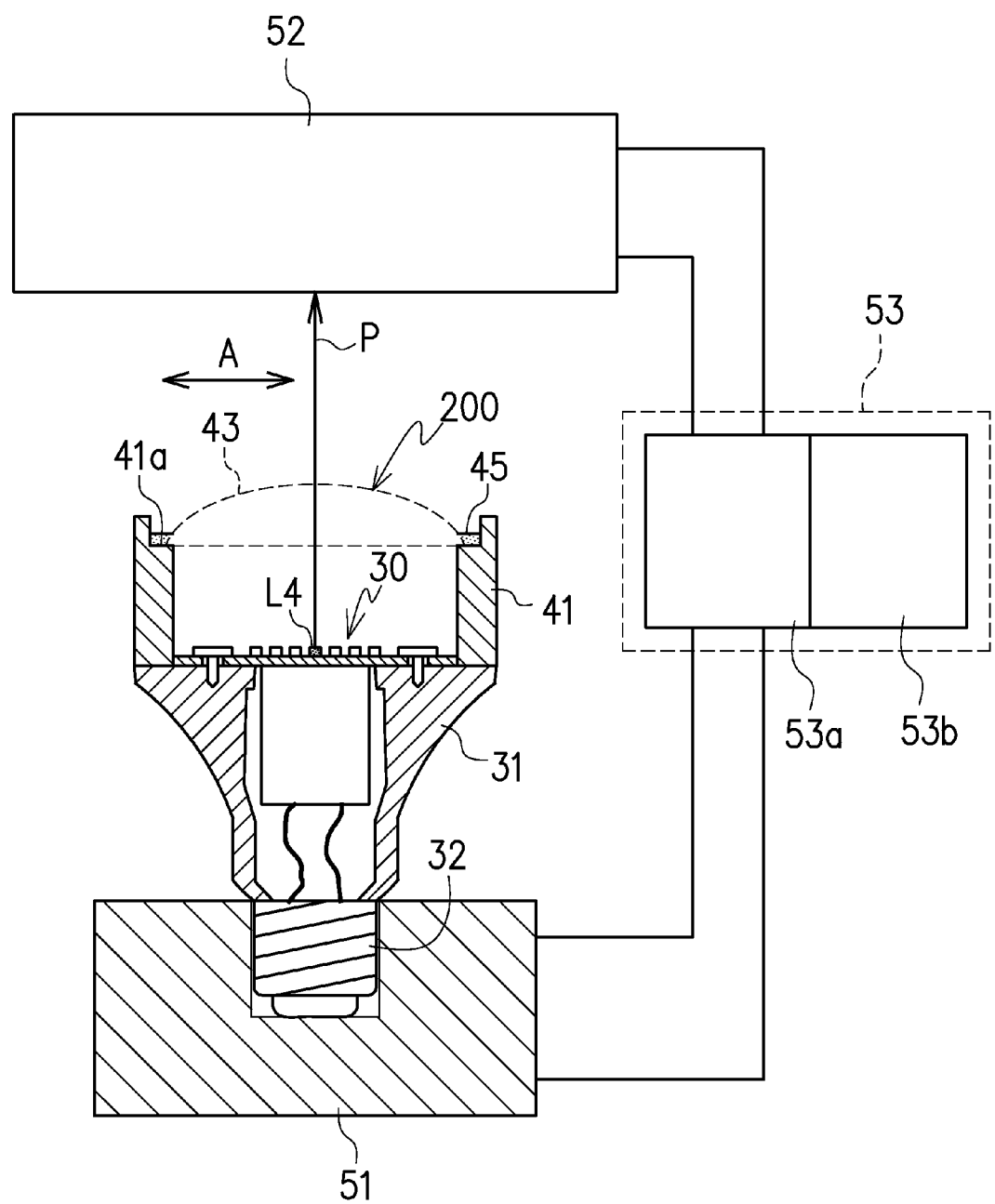
FIG. 19 shows an explanatory schematic view when a light source is positioned in a lighting device with use of position-detection apparatus.

FIG. 19 shows an explanatory schematic view when a light source 30 is positioned in a lighting device with use of position-detection apparatus. When the first light-emitting elements 1' of the light source 30 are lit, the position-detection device 52 detects light P and the position of the first light-emitting elements 1' arranged on the center line, which divides the area 4 into two equal portions as a first portion which is the left part and a second portion which is the right part of the area 4 as shown in FIG. 3.

Figure 20:
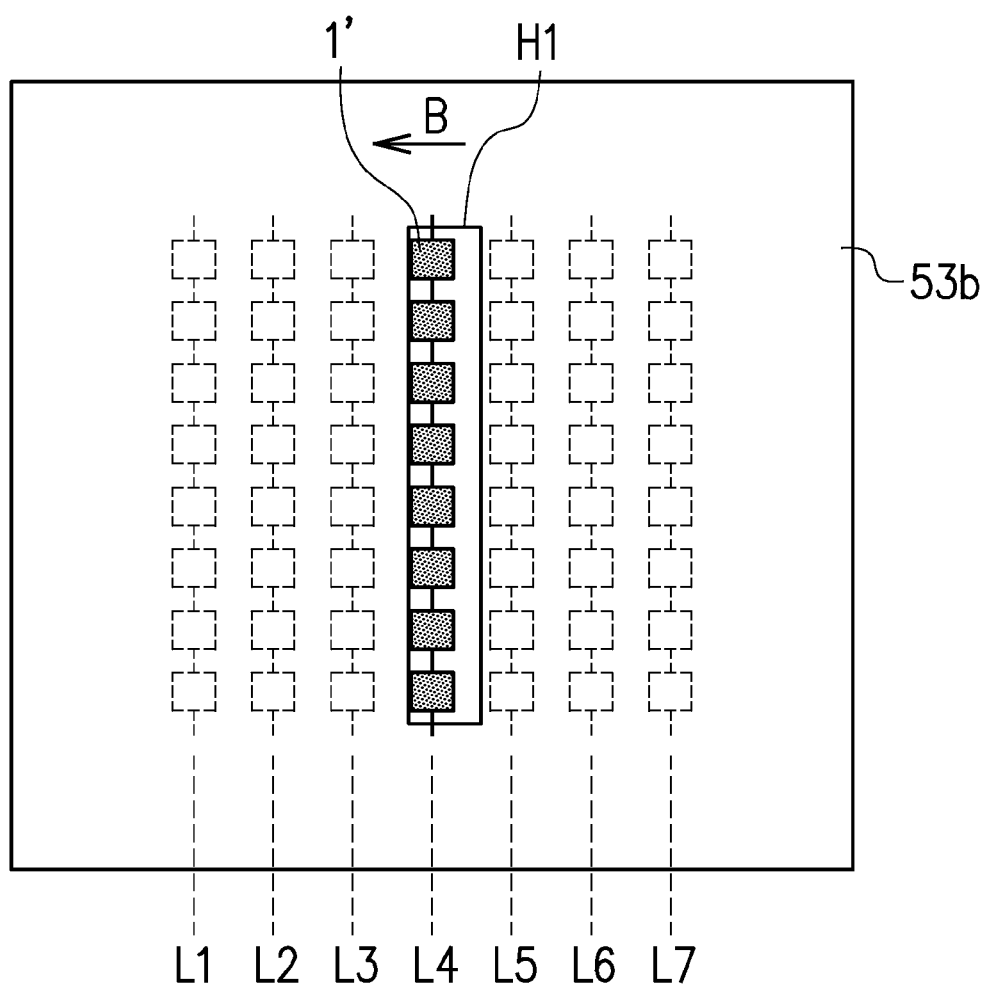
FIG. 20 shows a schematic view to show a group L4 of light-emitting elements arranged in a line that extends on a center of area in which light-emitting elements are arranged but being out of alignment as an example.

FIG. 20 shows a schematic view to show a group L4 of light-emitting elements arranged in a line that extends on a center of the area, and the first light-emitting elements 1' appear to be positioned too far left (in a direction shown as arrow B) in the first frame H1 as an example. Accordingly, the gap of position can be recognized as shown in the display part 53b.

Figure 21:
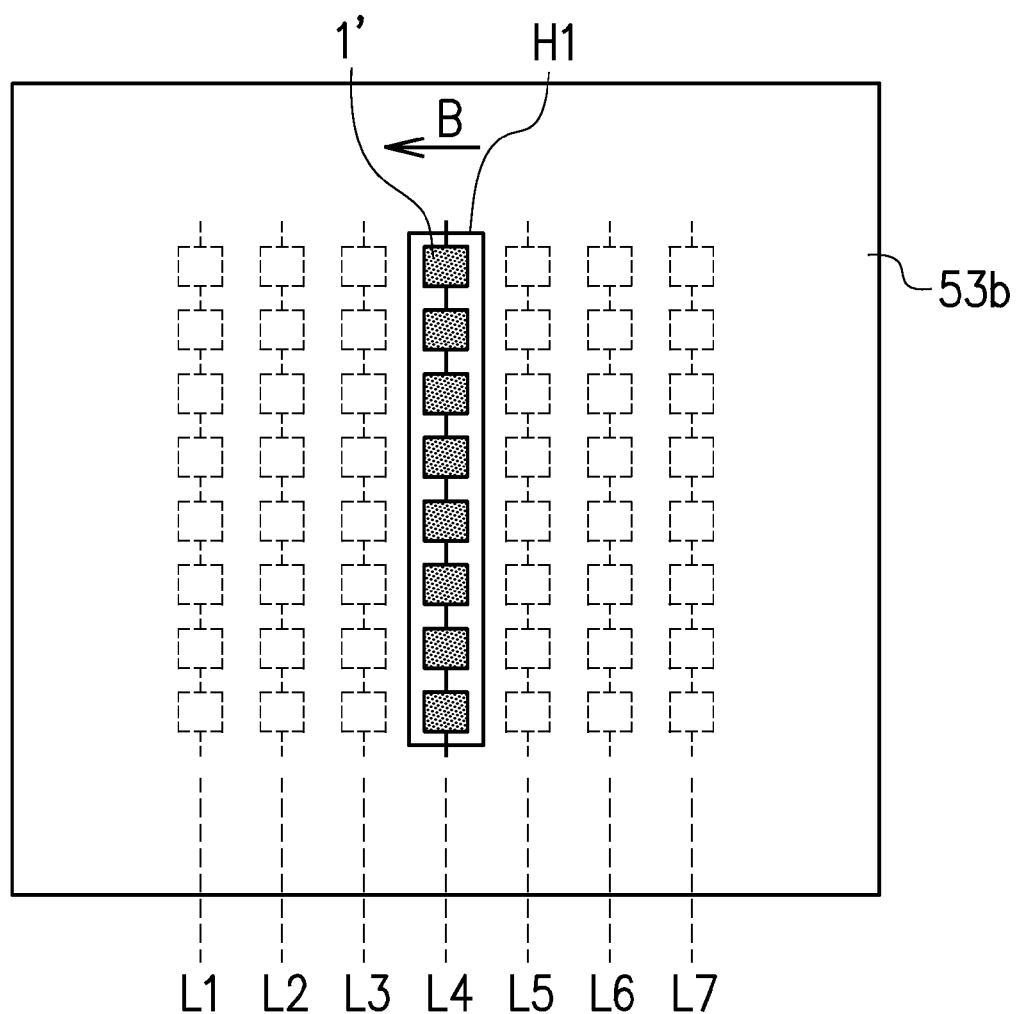
FIG. 21 shows a schematic view to show that the light-emitting elements in the group L4 are aligned.

FIG. 21 shows an explanatory schematic view to show that the light-emitting elements in the group L4 are aligned. After the right position of the first light-emitting elements 1 of the light source is recognized, the light source can be fastened to the lighting device.

Accordingly, when combining a light source with a lighting device, it is possible to align the center of the light source with the center of the lighting device.

This embodiment, the first light-emitting element 1' is positioned on a center line which is shown as an imaginary line IL5 dividing the area 4 into two equal portions at the first side and the second side. The imaginary line IL5 shown in FIG. 5 runs on a center of the area 4, passing through the light-emitting elements positioned at the center of each group in a plan view. FIG. 10 is a front view of a lighting device according to a ninth embodiment of the present invention. The lighting device in this embodiment may include a light source according to an embodiment explained herein.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A light source comprising:
   a substrate comprising a first electrode and a second electrode;
   light-emitting elements arranged in an area and divided into groups each comprising a same number N of light-emitting elements that are electrically connected to one another in series in each group of the groups, the light-emitting elements of each group being electrically connected in series to the first electrode and to the second electrode of the substrate; and
   a light-transmitting resin comprising a phosphor, the light-transmitting resin sealing the light-emitting elements,
   wherein the light-emitting elements comprise a first light-emitting element that is positioned at a center of the area and is configured to start emitting light at a first voltage value directly applied to the light-emitting elements within a range of 80 percent to 90 percent of a second voltage value directly applied to the light-emitting elements at which the light-emitting elements except the first light-emitting element are configured to start emitting light.

2. The light source according to claim 1,
   wherein the area is a light-emitting portion of the light source.

3. A lighting device comprising:
   a light source comprising:
      a substrate comprising a first electrode and a second electrode;
      light-emitting elements arranged in an area and divided into groups each comprising a same number N of light-emitting elements that are electrically connected to one another in series in each group of the groups, the light-emitting elements of each group being electrically connected in series to the first electrode and to the second electrode of the substrate; and
      a light-transmitting resin comprising a phosphor, the light-transmitting resin sealing the light-emitting elements; and
   a holder to which the light source is attached,
   wherein the light-emitting elements comprise a first light-emitting element that is configured to start emitting light at a first voltage value directly applied to the light-emitting elements within a range of 80 percent to 90 percent of a second voltage value directly applied to the light-emitting elements at which the light-emitting elements except the first light-emitting element are configured to start emitting light.

4. The lighting device according to claim 3, further comprising:
   a light-transmitting cover arranged above the light source.

5. The lighting device according to claim 4,
   wherein the light-transmitting cover is positionable with respect to the first light-emitting element of the light source.

6. The lighting device according to claim 4,
   wherein the light-transmitting cover comprises a lens arranged above the light source.

7. The lighting device according to claim 3,
   wherein the first light-emitting element is positioned at a center of the area, and the area that is a light-emitting portion of the light source.

8. The lighting device according to claim 3,
   wherein the first light-emitting element is two or more first light-emitting elements arranged in one of the groups, and
   wherein the one of the groups comprising the first light-emitting elements is positioned at a center of the area.

9. The lighting device according to claim 3,
   wherein the first light-emitting element is positioned adjacent to an edge of the area.

10. The lighting device according to claim 3,
wherein the first light-emitting element is a plurality of first light-emitting elements each arranged in one of two or more of the groups.

11. The lighting device according to claim 3,
wherein the light source is positionable on the holder.

12. The lighting device according to claim 3,
wherein the first light-emitting element is positioned at a corner of the area.

13. The lighting device according to claim 3,
wherein a number of the second light-emitting elements is greater than a number of the first light-emitting elements.

14. A lighting device comprising:
a light source comprising light-emitting elements electrically connected to one another, and comprising a light-transmitting resin that comprises a phosphor, the light-transmitting resin sealing the light-emitting elements, and the light-emitting elements comprising a first light-emitting element positioned at a center of an area in which the light-emitting elements are arranged; and
a light-transmitting cover arranged above the light source,
wherein the first light-emitting element is configured to start emitting light at a first voltage value directly applied to the light-emitting elements within a range of 80 percent to 90 percent of a second voltage value directly applied to the light-emitting elements at which the light-emitting elements except the first light-emitting element are configured to start emitting light, and
wherein the first light-emitting element is positioned at a center of the light-transmitting cover in a plan view.

15. The lighting device according to claim 14, further comprising:
a holder to which the light source is attached,
wherein the light-transmitting cover arranged above the light source is a condenser lens.

16. The lighting device according to claim 14,
wherein the light-transmitting cover includes a curved surface.

* * * * *